United States Patent [19]

Nakagawa et al.

[11] Patent Number: 5,184,196
[45] Date of Patent: Feb. 2, 1993

[54] PROJECTION EXPOSURE APPARATUS

[75] Inventors: Masahiro Nakagawa; Hideo Mizutani, both of Yokohama; Kouichirou Komatsu, Tokyo; Yawara Nojima, Chiba, all of Japan

[73] Assignee: Nikon Corporation, Tokyo, Japan

[21] Appl. No.: 810,130

[22] Filed: Dec. 19, 1991

[30] Foreign Application Priority Data

Dec. 26, 1990 [JP] Japan .................................. 2-406801

[51] Int. Cl.$^5$ ............................................ G01B 11/00
[52] U.S. Cl. .................................... 356/401; 250/548; 356/363; 355/43; 355/53
[58] Field of Search ............... 356/399, 400, 401, 363; 250/548; 355/43, 53

[56] References Cited

U.S. PATENT DOCUMENTS

| | | | |
|---|---|---|---|
| 4,677,301 | 6/1987 | Tanimoto et al. | 250/548 |
| 4,814,829 | 3/1989 | Kosugi et al. | 353/53 |
| 5,004,348 | 4/1991 | Magome | 356/401 |
| 5,070,250 | 12/1991 | Komatsu et al. | 250/548 |

*Primary Examiner*—F. L. Evans
*Attorney, Agent, or Firm*—Shapiro and Shapiro

[57] ABSTRACT

A projection exposure apparatus comprises a projection optical system for forming an image of a predetermined pattern on a mask onto a photosensitive substrate under exposure light having a first wavelength, an illumination system for illuminating a mask on the photosensitive substrate with light having a second wavelength different from the first wavelength through the projection optical system so as to attain alignment, and a detection system for detecting light reflected by the mark. The illumination system comprises a light source for emitting the light having the second wavelength, a first field stop for defining an illumination field on the photosensitive substrate and a second field stop for defining an illumination field on the photosensitive substrate. The first field stop has at least two linear edges which extend in a direction substantially perpendicular to a sagittal direction in a visual field of the projection optical system and are juxtaposed in the sagittal direction at a predetermined interval. The second field stop extends in a direction substantially perpendicular to a meridional direction in a visual field of the projection optical system and has at least two linear edges juxtaposed in the meridional direction at a predetermined interval.

7 Claims, 10 Drawing Sheets

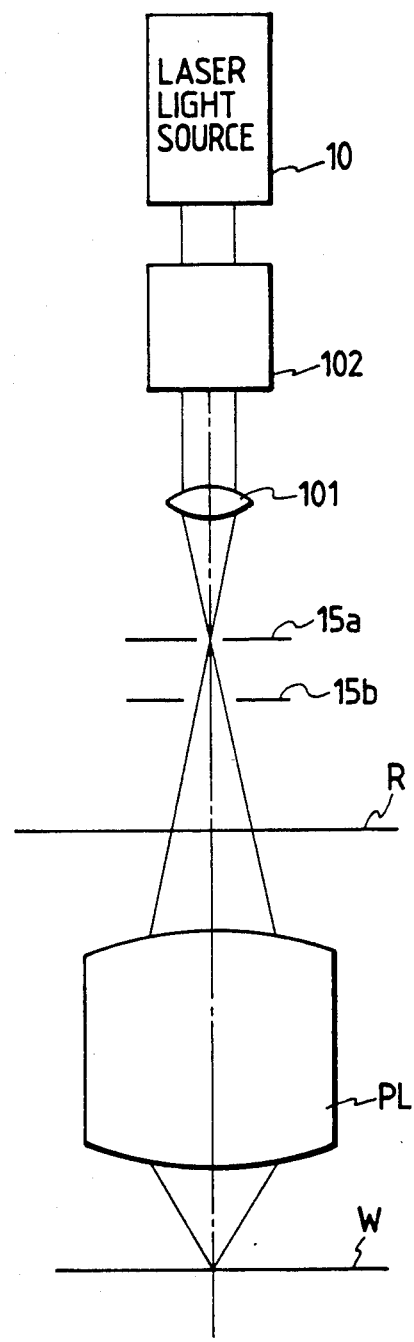 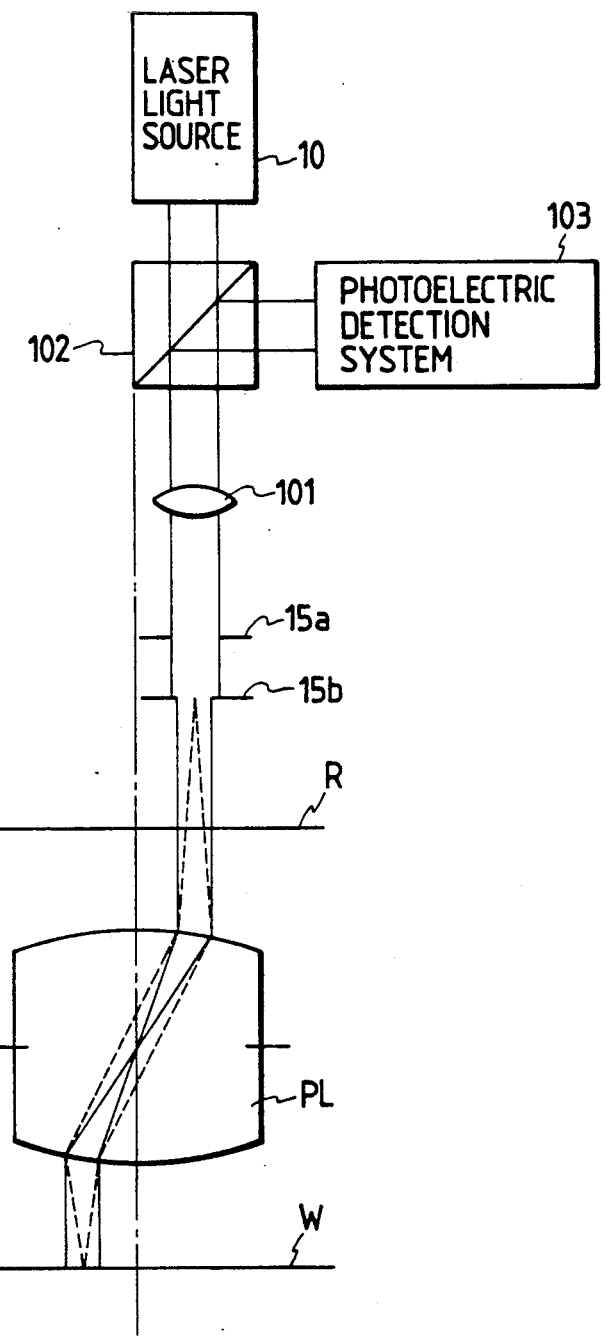

PROJECTION EXPOSURE APPARATUS

BACKGROUND OF THE INVENTION

1. Field of the Invention

The present invention relates to a projection exposure apparatus and, more particularly, to a projection exposure apparatus used in a manufacturing process of a semiconductor integrated circuit.

2. Related Background Art

In recent years, in a lithography process, as an apparatus for transferring a micro-pattern onto a photosensitive substrate (a semiconductor wafer formed with a resist layer), a step-and-repeat type reduction projection exposure apparatus stepper) is often used. In a stepper of this type, since the resolution line width on a wafer has reached a value on the submicron order (about 0.5 μm) as the degree of integration of semiconductor elements has been increased, a pattern of a reticle (having the same meaning as a mask) must be aligned to one shot region on the wafer with alignment precision (normally, about 1/5 the resolution line width) corresponding to the resolution.

In a projection exposure apparatus such as a stepper, in order to focus a reticle pattern on a wafer at high resolution, the chromatic aberration of a projection optical system is satisfactorily corrected for only exposure illumination light (e.g., KrF excimer laser light having a wavelength of 248 nm) in the present state. Therefore, when an alignment system for overlaying a projection image of a reticle pattern onto a shot region employs a TTR (through-the-reticle) method or a TTL (through-the-lens) method, light for illuminating an alignment mark is illumination light having a wavelength equal to or very close to that of exposure light. For this reason, the alignment illumination light is attenuated by a resist layer before it reaches a wafer mark, and light reflected by the mark (regularly reflected light, scattered light, diffracted light, and the like) is also attenuated. Thus, the wafer mark cannot be recognized with a sufficient light amount, and the detection precision of the alignment system is undesirably impaired. Furthermore, when alignment illumination light is radiated onto the wafer mark, the corresponding portion of the resist layer is exposed. When the wafer is subjected to various processes after development, the corresponding mark on the wafer is destroyed. For this reason, the wafer mark cannot be used in alignment in an overlaying exposure process of the next layer.

As disclosed in, e.g., U.S. Pat. No. 4,677,301 and U.S. Pat. No. 5,004,348, as a light source for emitting alignment illumination light, a light source (e.g., an He-Ne laser having a wavelength of 633 nm) having a wavelength different from that of exposure light is used, an alignment mark formed on a wafer or reticle is detected, and the position of the wafer or reticle is detected based on the optical information.

In a method disclosed in U.S. Pat. No. 4,677,301, a mark formed on a wafer or reticle is relatively scanned by spot light (having a slit pattern) obtained by focusing a laser beam, scattered and diffracted light components from the mark edge are photoelectrically detected, thereby detecting a mark position on the basis of the center of a photoelectric signal waveform (to be referred to as an LSA (laser step alignment) method hereinafter). In a method disclosed in U.S. Pat. No. 5,004,348, coherent laser beams (parallel light beams) are simultaneously radiated from two directions on a diffraction grating mark to form one-dimensional interference fringes, and the position of the diffraction grating mark is specified using the interference fringes. The alignment method using interference fringes includes a heterodyne method for providing a predetermined frequency difference between two laser beams radiated from two directions, and a homodyne method having no frequency difference. In the homodyne method, still interference fringes are formed to be parallel to the diffraction grating mark, and the diffraction grating mark (object) must be finely moved in its pitch direction in position detection. The position of the grating mark is obtained with reference to the interference fringes. In contrast to this, in the heterodyne method, interference fringes are moved at a high speed in their fringe direction (pitch direction) according to the frequency difference (beat frequency) between the two laser beams. The position of the grating mark cannot be obtained with reference to the interference fringes, but is obtained with reference to a time factor (phase difference) upon high-speed movement of the interference fringes.

For example, in the heterodyne method, a phase difference (within ±180°) between a photoelectric signal (optical beat signal) detected by intensity-modulating ±1st-order diffracted light from the grating mark, and an optical beat signal of reference interference light, which is separately formed based on two light beams using a reference grating, is obtained, thereby detecting a position shift of the grating mark within ±P/4 a grating pitch P.

In the above-mentioned LSA method, or in the alignment method using the diffraction grating, in an optical system (illumination system) for guiding alignment light, a field stop is arranged at a position substantially conjugate with a wafer. The field stop is used for limiting an illumination region for illuminating only an alignment mark formed on a wafer, and is particularly used for preventing reflected light by a circuit pattern on a transfer region or another alignment mark from becoming incident on a detector as noise light.

However, in the above-mentioned prior art, alignment light is incident on a projection optical system from a direction outside the optical axis, and an astigmatism occurs due to the difference between the wavelengths of exposure light and alignment light. Assume that a field stop is arranged at a plane substantially conjugate with a wafer in an illumination system, and at a sagittal image surface (a position where an edge extending in a direction perpendicular to the sagittal direction within the visual field of the projection optical system is focused) of the projection optical system with respect to alignment light. An image pattern of the field stop on the wafer is then formed in a defocus state in a meridional direction (to be referred to as an "M direction" hereinafter) in the visual field of the projection optical system due to the astigmatism (i.e., the edge extending in the sagittal direction in the visual field of the projection optical system is formed in a defocus state). For this reason, a proper illumination field (illumination region) cannot be formed, and illumination light falling outside a region near the alignment mark on the wafer undesirably illuminates other alignment marks and a circuit pattern. In addition, stray light is produced under the influence of, e.g., inter-surface reflection between the projection optical system and the wafer, or between lens elements of the projection optical system. For this reason, light from a portion other than a predetermined alignment mark is mixed in an output from an alignment sensor as noise. For example, a case will be examined below wherein a position shift of an alignment mark on a wafer with respect to a reference grating is detected using the heterodyne method.

FIG. 12 shows the positional relationship between a visual field if of the projection optical system and alignment marks on a wafer. A plurality of alignment marks WM1 to WM4 are formed outside a rectangular pattern region PA inscribing the visual field if of the projection optical system so as to be adjacent to the pattern region PA. Assume that the diffraction-grating-like alignment marks WM1 to WM4 are arranged on the wafer, so that the sagittal direction (to be referred to as the "S direction" hereinafter) in the visual field if of the projection optical system coincides with a measurement direction. More specifically, two light beams are incident from the S direction on the mark at a predetermined angle, and measurement is performed using an edge (an edge in the M direction) extending in a direction perpendicular to the S direction. Therefore, the edge of the alignment mark extends in substantially the M direction. Note that the M direction is a radiation direction having an optical axis AX in the visual field if of the projection optical system as the center, and the S direction is a direction perpendicular to the M direction. FIG. 10 pays attention to one of the plurality of alignment marks, and shows the alignment mark WM1 and an illumination region SA. In this case, a rectangular stop is arranged at the sagittal image surface located at a position substantially conjugate with the wafer, and an edge extending in a direction perpendicular to the S direction is focused on the wafer W. This edge is indicated by a bold line Ed in FIG. 11. In contrast to this, as described above, the edge extending in the direction perpendicular to the M direction is formed in a defocus state (a state indicated by a wavy line) due to the astigmatism. As a result, the illumination region cannot be clearly defined. Therefore, interference light produced from marks other than the alignment mark WM1 to be detected or a circuit pattern P is mixed in interference light to be detected as a noise light component as represented by the following equation, thus causing a phase shift.

$$\phi = A\cos(\omega t + \phi) + \Sigma N\cos(\phi t + \phi_N) \quad (1)$$

(A: amplitude, $\omega$: beat frequency, $\phi$: phase, N: amplitude of noise component, $\phi$: phase of noise component)

In this method, the phase shift is detected as an alignment shift, and as a result, an alignment error occurs.

FIG. 11 shows the phase shift state. The abscissa represents a beat signal (reference signal) component of reference interference light. A vector component of a beat signal of interference light from the mark WM1 is represented by $A_S$, and a vector component of a beat signal of noise light is represented by $N_S$. $\phi_A$ represents a phase difference between the beat signal (reference signal) of reference interference light, and the beat signal of interference light from the mark WM1, and $\phi_N$ represents a phase difference between the reference signal and the beat signal of the noise signal. A phase difference between a synthesized component $T_S$ of the vector components $A_S$ and $N_S$, and the reference signal component is represented by $\phi_S$. Therefore, the phase difference $\phi_S$ as alignment information includes an alignment error caused by noise light, thus causing an alignment error.

In the LSA method, since a photoelectric signal is distorted due to the influence of stray light or noise light from a portion other than the alignment mark, the mark position cannot be accurately detected, thus causing an alignment shift.

As described above, only one field stop arranged in the illumination optical system cannot define a proper illumination region due to the astigmatism. The alignment sensor undesirably detects position information from a portion other than a wafer alignment mark due to the influence of stray light, thus causing an alignment error.

SUMMARY OF THE INVENTION

The present invention has been made in consideration of the above situation, and has as its object to limit an illumination region (illumination field) of alignment light to a proper range, and to prevent the influence of stray light, thereby improving alignment precision, and exposing a circuit pattern at a higher degree of integration.

In order to achieve the above object, according to one aspect of the present invention, there is provided a projection exposure apparatus, which comprises a projection optical system for forming an image of a predetermined pattern on a mask onto a photosensitive substrate under exposure light having a first wavelength, an illumination system for illuminating a mask on the photosensitive substrate with light having a second wavelength different from the first wavelength through the projection optical system so as to attain alignment, and a detection system for detecting light reflected by the mark, wherein the illumination system comprises:

a light source for emitting the light having the second wavelength;

a first field stop for defining an illumination field on the photosensitive substrate, the first field stop having at least two linear edges which extend in a direction substantially perpendicular to a sagittal direction in a visual field of the projection optical system and which are juxtaposed in the sagittal direction at a predetermined interval: and a second field stop for defining an illumination field on the photosensitive substrate, the second field stop extending in a direction substantially perpendicular to a meridional direction in a visual field of the projection optical system and which has at least two linear edges juxtaposed in the meridional direction at a predetermined interval, and the first and second field stops are juxtaposed to be separated by a distance according to an astigmatism of the projection optical system, caused by the light having the second wavelength, in a direction of an optical axis of the illumination optical system, and the edges of both the first and second field stops are focused on the photosensitive substrate through the projection optical system.

According to the present invention, even when the projection optical system suffers from an astigmatism with respect to alignment light, since the field stops are respectively arranged at planes substantially conjugate with a wafer in the illumination system, and at the sagittal image surface and the meridional image surface of the projection optical system with respect to alignment illumination light, the two stops can form proper illumination fields on the wafer, and stray light caused by reflection between the projection optical system and the wafer, or between element surfaces of the projection optical system can be effectively prevented. Therefore, light from a portion other than a wafer mark can be prevented from becoming incident on, e.g., an alignment sensor, and an alignment error can be prevented, thus allowing high-precision alignment.

BRIEF DESCRIPTION OF THE DRAWINGS

FIG. 9A shows the focusing relationship of the stop 15a arranged at a sagittal image surface in an LSA system;

FIG. 9B shows the focusing relationship of the stop 15a arranged at a meridional image surface in an LSA system;

DETAILED DESCRIPTION OF THE PREFERRED EMBODIMENT

An embodiment of the present invention will be describe in detail below with reference to the accompanying drawings.

Figure 2:
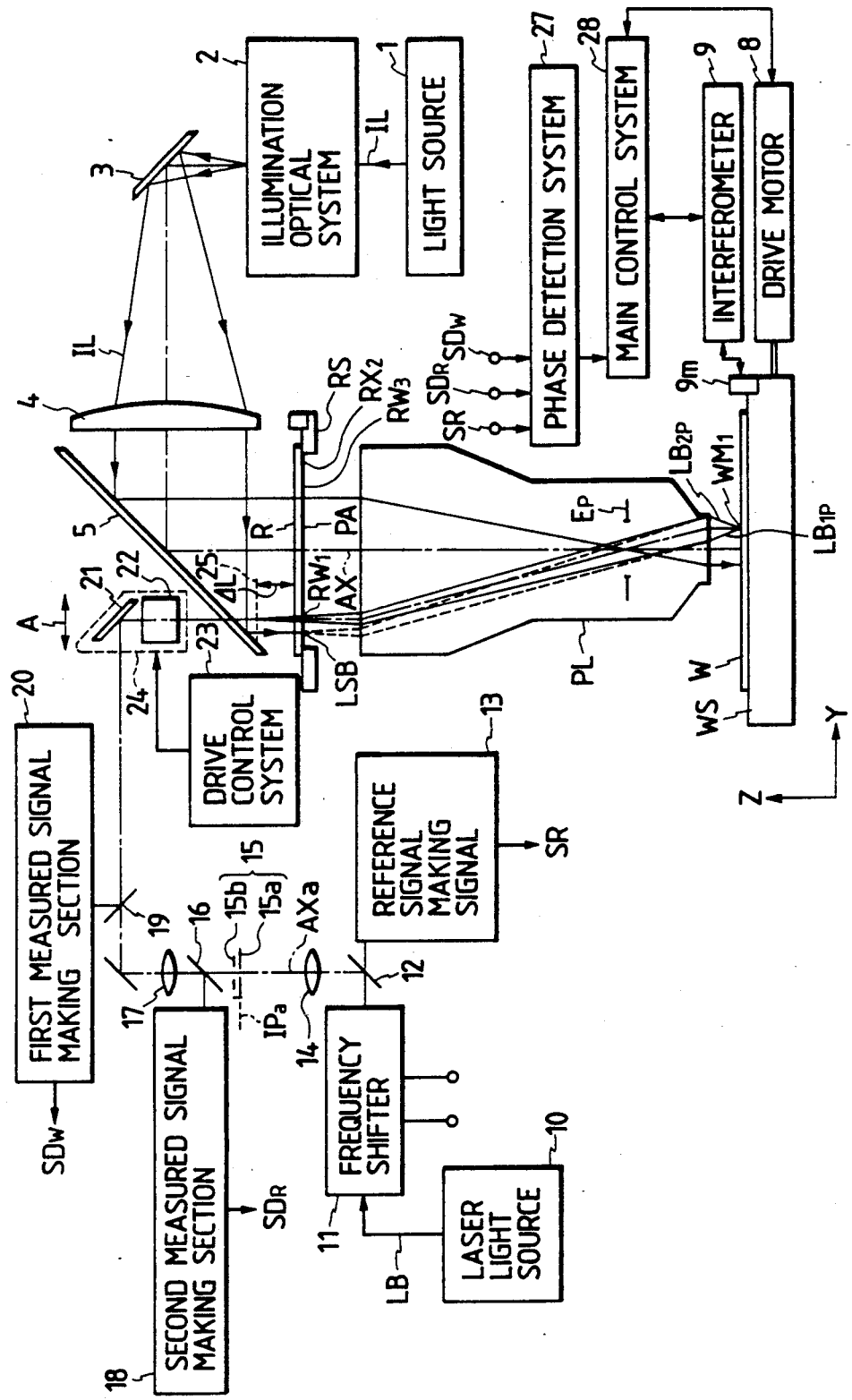
FIG. 2 is a schematic plan view showing the arrangement of a stepper comprising a TTR type alignment system according to the first embodiment of the present invention.

FIG. 2 is a schematic plan view showing the arrangement of a stepper comprising a TTR type heterodyne alignment system according to the first embodiment of the present invention.

In this stepper, an alignment system 24 is movable by a drive control system 23 in a direction of an arrow A in correspondence with a change in position of a reticle mark according to the chip size of a semiconductor element.

In FIG. 2, an illumination light source 1 such as a KrF excimer laser device, generates exposure illumination light IL in a wavelength region capable of exposing a resist layer. The exposure light IL is incident on an illumination optical system 2 including an optical integrator (fly-eye lens). The exposure light IL, which is uniformed and subjected to speckle reduction by the illumination optical system, reaches a dichroic mirror 5 through a mirror 3 and a main condenser lens 4. The dichroic mirror 5 reflects the exposure light IL from the main condenser lens 4 vertically downward, thereby illuminating a reticle R at a uniform illuminance. The dichroic mirror 5 is arranged above the reticle R to be inclined at 45°.

Four alignment transparent windows (only $RW_1$ and $RW_3$ are illustrated) are formed in a light-shielding band (chromium layer) LSB having a predetermined width and surrounding a pattern region PA, in correspondence with the sides of the pattern region PA. Furthermore, three reticle alignment marks (only $RX_2$ is illustrated) for aligning the reticle R in the X, Y, and rotational directions are formed outside the transparent windows (on the peripheral portion of the reticle). The reticle R is placed on a reticle stage RS, and is aligned, so that the central point of the pattern region PA coincides with an optical axis AX.

The exposure light IL transmitted through the pattern region PA is incident on a two-side telecentric projection optical system PL. The projection optical system PL projects (focuses) a projection image of a circuit pattern on the reticle R to overlap one shot region on a wafer W on the surface of which a resist layer is formed. Four diffraction-grating-like wafer marks (only WM1 is illustrated) are formed at positions near the shot region on the wafer W to have a predetermined positional relationship with the shot region in correspondence with the transparent windows of the reticle R. The chromatic aberration of the projection optical system PL is satisfactorily corrected for the wavelength of the exposure light IL (e.g., KrF excimer laser). At this exposure wavelength, the reticle R and the wafer W are arranged at conjugate positions. The wafer W is placed on a wafer stage WS, which can be two-dimensionally moved in a step-and-repeat method by a drive motor 8. Upon completion of a transfer/exposure process of the reticle R for one shot region on the wafer W, the wafer W is stepped to the next shot position. The two-dimensional position of the wafer stage WS is detected by an interferometer 9 at a resolution of, e.g., about 0.01 μm. A movable mirror 9 m for reflecting a laser beam from the interferometer 9 is fixed to the end portion of the wafer stage WS. A detection signal from the interferometer 9 is supplied to a main control system 28.

Figure 3:
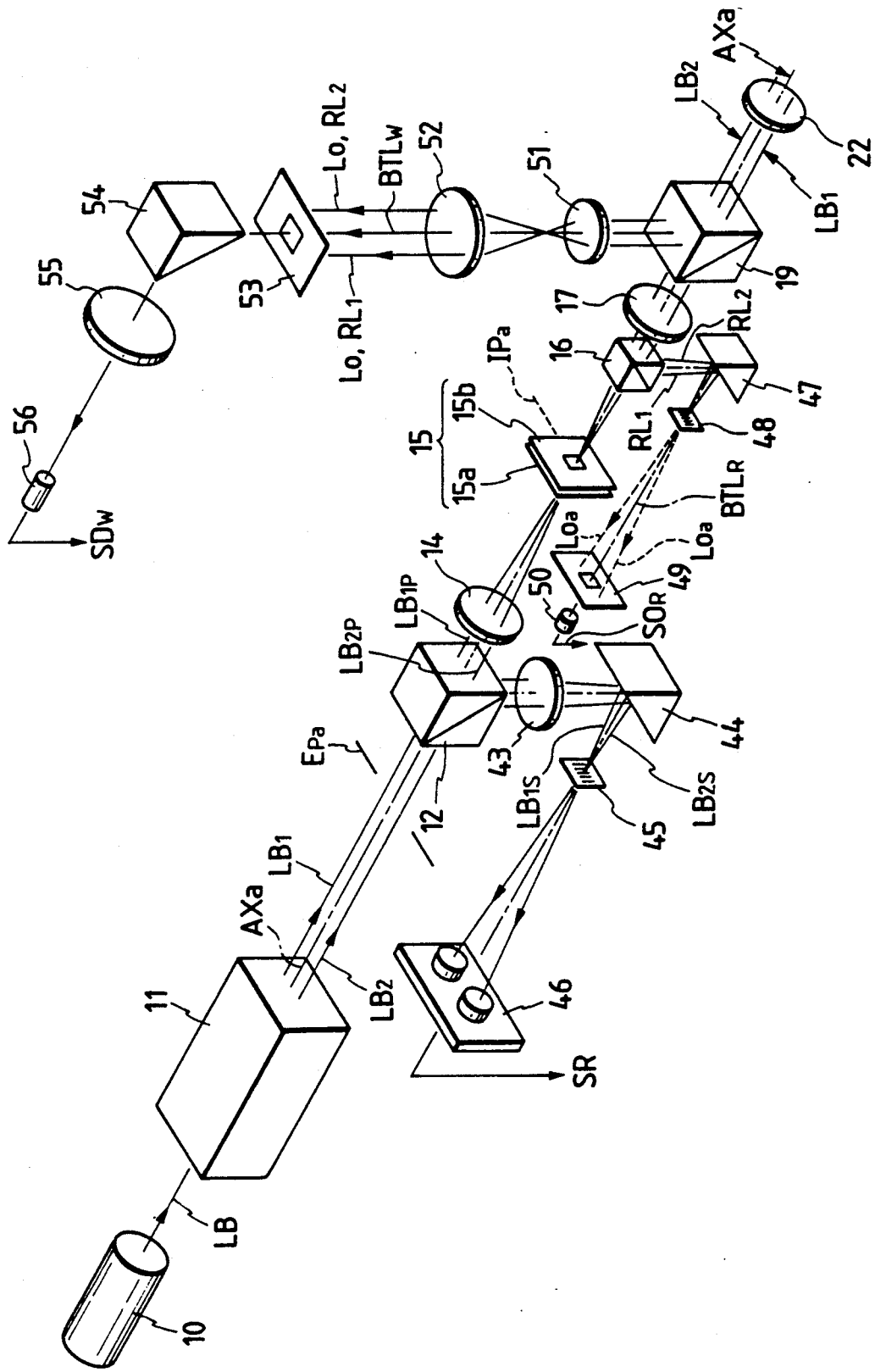
FIG. 3 is a perspective view showing the detailed arrangement of an alignment system in FIG. 2.
Figure 4:
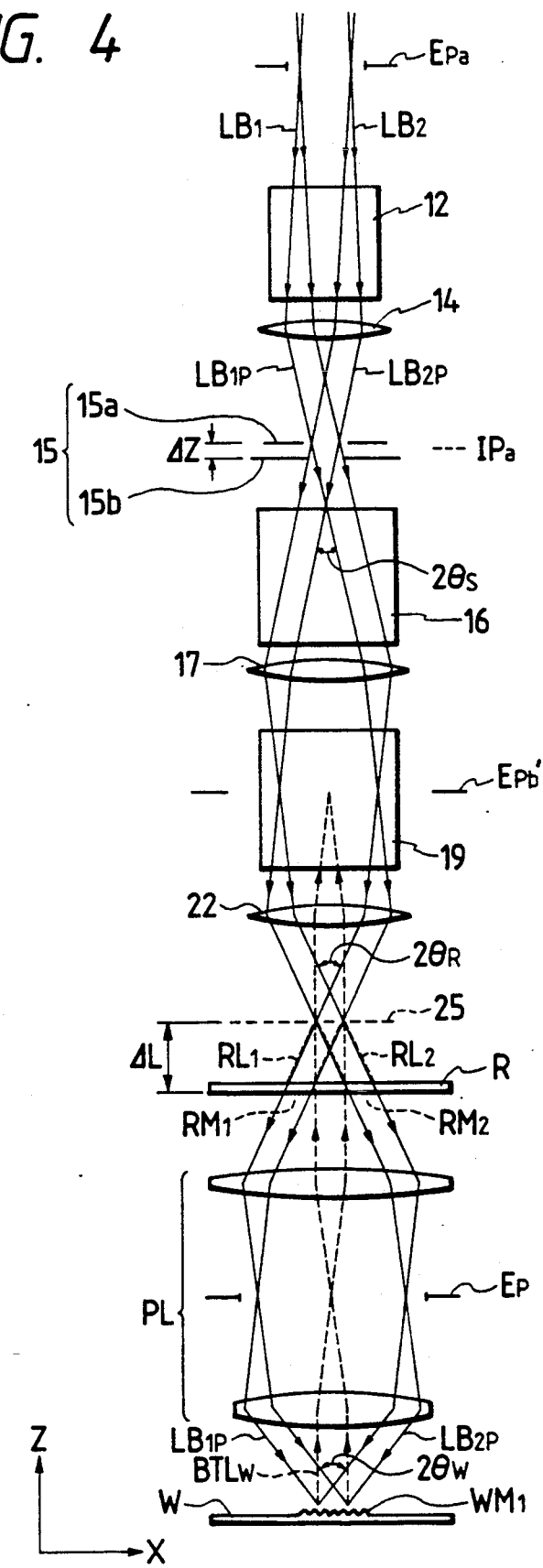
FIG. 4 is a plan view showing a portion of the alignment system shown in FIG. 2 when viewed from a sagittal direction.
Figure 5:
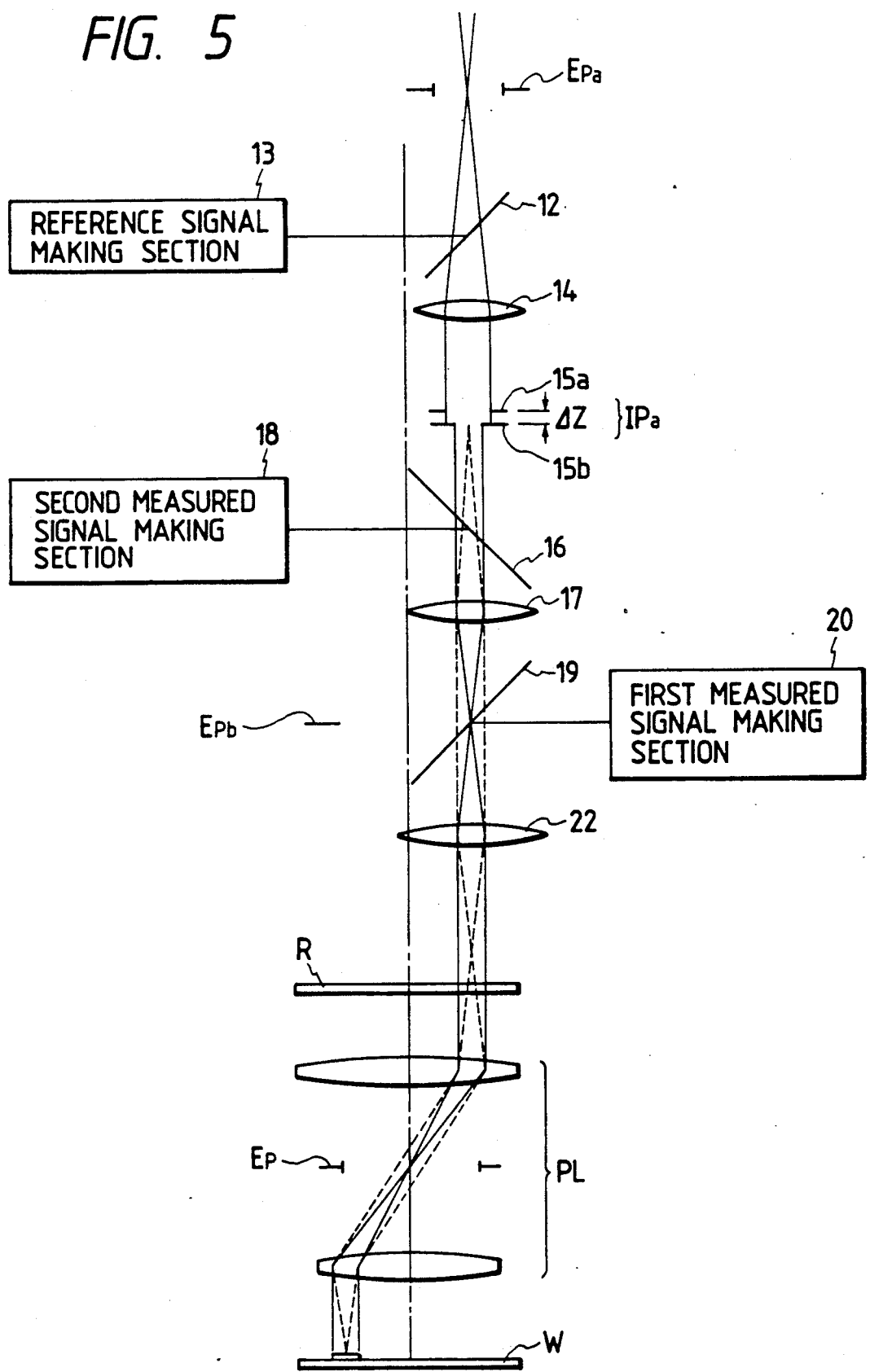
FIG. 5 is a plan view showing a portion of the alignment system shown in FIG. 2 when viewed from a meridional direction.

The TTR type alignment system of this embodiment will be described below with reference to FIGS. 3, 4, and 5. FIG. 3 is a perspective view showing the detailed arrangement of the alignment system, and a mirror 21 shown in FIG. 2 is omitted from FIG. 3. FIG. 4 is a plan view showing a portion of the alignment system when viewed from the S direction, and FIG. 5 is a plan view showing a portion of the alignment system when viewed from the M direction. As shown in FIG. 3, a laser light source 10 is a light source for emitting a laser beam LB in a wavelength region different from that of the exposure light IL. In this embodiment, the laser light source 10 comprises an He-Ne laser light source for emitting a laser beam having a wavelength of 633 nm, which has almost no sensitivity for the resist layer. The laser beam LB emitted from the laser light source 10 is incident on a two-beam frequency shifter 11 constituted by a ½ wave plate, a polarization beam splitter, a mirror, two acoustooptic elements, and the like. The laser beam LB is output from the shifter 11 as a beam $LB_1$ having a frequency $f_1$, and a beam $LB_2$ having a frequency $f_2$ ($f_2 = f_1 - \Delta f$), having a frequency difference $\Delta f$ from $f_1$. These beams $LB_1$ and $LB_2$ are output as linearly polarized light components, whose principal rays are parallel to each other to be separated at a predetermined interval, e.g., p-polarized beams. Note that the principal rays of the beams $LB_1$ and $LB_2$ are symmetrically located to sandwich an optical system AXa of the alignment system therebetween.

The directions of polarization of the two p-polarized beams $LB_1$ (frequency $f_1$) and $LB_2$ (frequency $f_2$) are rotated through about 45° by the ½ wave plate (not shown), and these beams are then focused to form spots at a pupil surface Epa of the alignment system (at a beam waist position, and at a plane substantially conjugate with an entrance pupil Ep of the projection optical system PL), or a position near the pupil surface, as shown in FIG. 4. Thereafter, the beams reach a polarization beam splitter (PBS) 12. The beam $LB_1$ is split into a p-polarized beam $LB_{1P}$ and an s-polarized beam $LB_{1S}$, which have the frequency $f_1$, and the beam $LB_2$ is split into a p-polarized beam $LB_{2P}$ and an s-polarized beam $LB_{2S}$, which have the frequency $f_2$. The two s-polarized beams $LB_{1S}$ (frequency $f_1$) and $LB_{2S}$ (frequency $f_2$) reflected by the PBS 12 are incident on a reference signal making section 13 (FIGS. 2 and 5) constituted by a lens system (inverse Fourier transformation lens) 43, a mirror 44, a reference diffraction grating 45 arranged at a rear-side focal plane of the lens system 43, and a photoelectric detector 46. The two beams $LB_{1S}$ and $LB_{2S}$ are reflected by the mirror 44 through the lens system 43. These beams are incident from two different directions on the reference diffraction grating 45, which is fixed on a plane substantially conjugate with the wafer W on the apparatus, at a predetermined crossing angle as parallel beams, and are focused (cross) thereon. The photoelectric detector 46 has two light-receiving elements (or a two-split light-receiving element). The detector 46 independently receives (photoelectrically converts), e.g., an interference light component between a 0th-order light component of the beam $LB_{1S}$ transmitted through the reference diffraction grating 45, and a +1st-order diffracted light component (the counterclockwise direction is represented by "+") of the beam $LB_{2S}$, which propagates coaxially with the 0th-order light component, and an interference light component between a −1st-order diffracted light component (the counterclockwise direction is represented by "−") of the beam $LB_{1S}$, and a 0th-order diffracted light component of the beam $LB_{2S}$, which propagates coaxially with the −1st-order diffracted light component. Photoelectric signals having a sine waveform according to the intensities of these two interference light components are added to each other by an amplifier (not shown). A photoelectric signal SR obtained as a result of the addition has a frequency proportional to a differential frequency $\Delta f$ between those of the beams $LB_{1S}$ and $LB_{2S}$, and serves as an optical beat signal. Note that the grating pitch of the reference diffraction grating 45 is determined to be equal to the pitch of interference fringes formed by the beams $LB_{1S}$ and $LB_{2S}$.

On the other hand, the two p-polarized beams $LB_{1P}$ (frequency $f_1$) and $LB_{2P}$ (frequency $f_2$) transmitted through the PBS 12 are converted by a lens 14 into parallel beams inclined at a predetermined angle, as shown in FIG. 4. These beams cross at a field stop 15a, arranged at the sagittal surface of the wafer W, of two field stops 15a and 15b (to be described in detail later) arranged at a rear-side focal plane (a plane substantially conjugate with the wafer) IPa of the lens 14. Thereafter, these beams emerge from a lens 17 through a beam splitter (NBS) 16. Thus, as shown in FIG. 4, the principal rays of the beams $LB_{1P}$ and $LB_{2P}$ become almost parallel to the optical axis AXa of the alignment system, and become focusing light beams focused as spots at two points, which are almost point-symmetrical to each other to sandwich the optical axis AXa therebetween, on a pupil surface Epb (beam waist position). The beams $LB_{1P}$ and $LB_{2P}$ are projected onto the dichroic mirror 5 from the vertical direction through a beam splitter (NBS) 19, a mirror 21, and a telecentric objective lens 22, and temporarily cross at a focal plane 25 at a crossing angle $2\theta_R$ uniquely determined by a crossing angle $2\theta_W$ on the wafer W. Thereafter, these beams are separated and radiated on the transparent window $RW_1$ on the pattern surface of the reticle R. Note that the focal plane 25 (the rear-side focal plane of the objective lens 22) is almost conjugate with the wafer surface at the wavelength of the alignment illumination light LB, and the interval between the focal plane 25 and the pattern surface of the reticle R corresponds to an axial chromatic aberration amount $\Delta L$ of the projection optical system PL.

Figure 6:
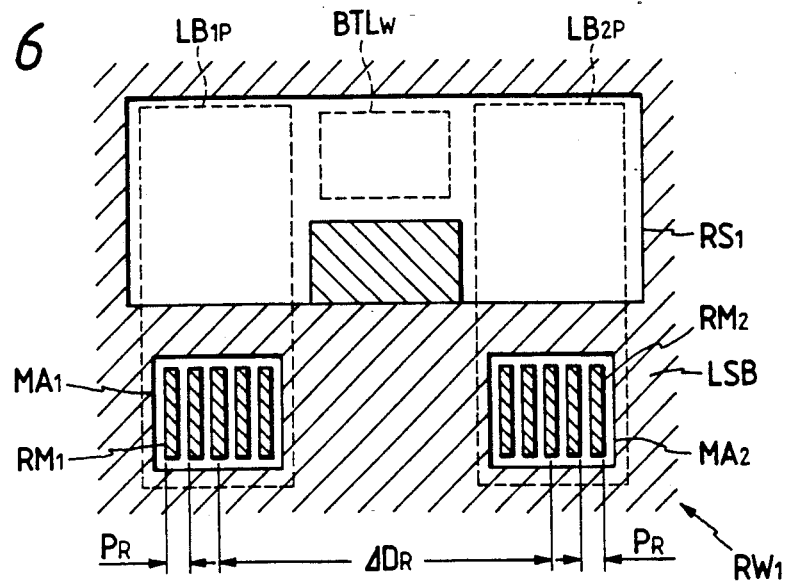
FIG. 6 is a view showing a transparent window shown in FIG. 2.

FIG. 6 shows the detailed structure of the transparent window $RW_1$ arranged in the light-shielding band LSB of the reticle R. The transparent window $RW_1$ is constituted by a rectangular transparent portion $RS_1$ and reticle mark regions $MA_1$ and $MA_2$. The transparent portion $RS_1$ passes the alignment beams $LB_{1P}$ and $LB_{2P}$, and diffracted light components (interference light components $BTL_W$) of the beams $LB_{1P}$ and $LB_{2P}$ at the wafer mark $WM_1$, as will be described in detail later. The mark regions $MA_1$ and $MA_2$ are arranged to be separated at a predetermined interval $\Delta D_R$. In these regions, diffraction-grating-like reticle marks $RM_1$ and $RM_2$ (duty = 1 : 1) are respectively formed at a pitch $P_R$.

The interval $\Delta D_R$ between the reticle marks $RM_1$ and $RM_2$ is given by $\Delta D_R = 2 \cdot L \cdot \tan\theta_R$.

In FIGS. 3, 4, and 5, the grating pitch $P_R$ of the reticle marks $RM_1$ and $RM_2$ irradiated with the beams $LB_{1P}$ and $LB_{2P}$ is determined as follows according to the crossing angle $2\theta_R$ of the beams $LB_{1P}$ and $LB_{2P}$ at the focal plane 25:

$$P_R = \lambda/2 \cdot \sin\theta_R = \pi/2M \cdot \sin\theta_W = P_w/2M \qquad (2)$$

where M is the projection magnification of the projection optical system PL with respect to this alignment light.

Therefore, a 1st-order diffracted light component $RL_1$ (frequency $f_1$) produced by the reticle mark $RM_1$, and a 1st-order diffracted light component $RL_2$ (frequency $f_2$) produced by the reticle mark $RM_2$ are returned to the NBS 16 through the dichroic mirror 5, the objective lens 22, the mirror 21, the NBS 19, and the lens 17 to be coaxial with the principal rays of the beams $LB_{1P}$ and $LB_{2P}$, and are reflected by the NBS 16. The reflected light components are then incident on a second measured signal making section 18 (FIGS. 2 and 5) constituted by a mirror 47, a transmission type reference grating plate 48 (diffraction grating), a spatial filter 49, and a photoelectric detector 50. Since the reference grating plate 48 is arranged at the rear-side focal plane (wafer conjugate plane) of the lens 17, the 1st-order diffracted light components $RL_1$ and $RL_2$ are incident from two different directions on the reference grating plate 48 at a predetermined crossing angle as parallel light beams through the mirror 47, and are focused (cross) thereon. In this manner, one-dimensional interference fringes flowing in the grating pitch direction are formed on the reference grating plate 48 in correspondence with the frequency difference Δf.

In this embodiment, for the sake of simplicity, a magnification between the focal plane 25 and the reference grating plate 48 is set to be an equal magnification (×1), and a grating pitch $P_{GR}$ of the reference grating plate 48 is set to be $P_{GR}=2P_R$. The reference grating plate 48 can be arranged within the wafer conjugate plane according to the size and position of interference fringes formed by the 1st-order diffracted light components $RL_1$ and $RL_2$.

As a result, when the 1st-order diffracted light components $RL_1$ and $RL_2$ are incident on the reference grating plate 48, ±1st-order diffracted light components are coaxially produced by the reference grating plate 48, and interference light components $BTL_R$ (parallel light components) between these diffracted light components are received by the photoelectric detector 50 through the spatial filter 49. A 0th-order light component $L_{0a}$ from the reference grating plate 48 is shielded by the spatial filter 49. A photoelectric signal corresponding to the interference light components $BTL_R$ from the photoelectric detector 50 becomes a sine-wave AC signal (an optical beat signal at a beat frequency) $SD_R$ according to the cycle of a change between light and dark patterns of the interference fringes. The AC signal $SD_R$ is output to a phase detection system 27.

On the other hand, the beams $LB_{1P}$ and $LB_{2P}$ radiate the reticle marks $RM_1$ and $RM_2$, and some components of these beams are incident on the projection optical system PL from directions outside the optical axis through the transparent portion $RS_1$. These beams are focused as spots to be point-symmetrical about the pupil center (optical axis AX) at an entrance pupil Ep. Thereafter, these beams become parallel light beams inclined at symmetrical angles about the optical axis AX with respect to the pitch direction of the wafer mark WMI, and are incident from two different directions on the wafer mark WM1 at the crossing angle $2\theta_W$, and are focused thereon. Note that the crossing angle $2\theta_W$ is as large as twice a numerical aperture (N.A.) at the exit (wafer) side of the projection optical system PL. The direction of a straight line connecting spots of the beams $LB_{1P}$ and $LB_{2P}$ formed to be point-symmetrical to each other to sandwich the optical axis AX at the entrance pupil Ep almost coincides with the pitch direction of the wafer mark WM1. When the beams $LB_{1P}$ and $LB_{2P}$ are incident on the wafer mark WM1 at the crossing angle $2\theta_W$, one-dimensional interference fringes are formed at a pitch $P_f 1/N$ (N is a natural number) times the pitch $P_W$ of the wafer mark WM1 ($P_f=P_W/2$ in this embodiment) in an arbitrary plane (wafer surface) perpendicular to the optical axis AX within a spatial region where the beams $LB_{1P}$ and $LB_{2P}$ cross each other. The interference fringes are moved (flow) in the pitch direction (X direction) of the wafer mark WM1 in correspondence with the differential frequency Δf between those of the beams $LB_{1P}$ and $LB_{2P}$, and a velocity V thereof is expressed by $V=\Delta f \cdot P_f$. The crossing angle $2\theta_W$ is determined to satisfy the following equation (3):

$$\sin\theta_W = \lambda/P_W \quad (3)$$

where λ is the wavelength of the alignment illumination light LB.

±1st-order diffracted light components are produced by the wafer marks WM1, are coaxially synthesized, and propagate in the reverse direction along the direction of the optical axis AX to pass the center of the entrance pupil Ep. These two diffracted light components interfere with each other since they are the same polarized light components (p-polarized light components), and become an optical beat (interference light) $BTL_W$. The light is returned to the NBS 19 through the projection optical system PL, the transparent window $RW_1$ of the reticle R, the dichroic mirror 5, the objective lens 22, and the mirror 21, and is reflected by the NBS 19. Then, the light is incident on a first measured signal making section 20 (FIGS. 2 and 5) constituted by a focal enlargement relay systems 51 and 52, a spatial filter 53, a mirror 54, a focusing lens 55, and a photoelectric detector 56.

In the first measured signal making section 20, the interference light $BTL_W$ from the wafer mark WM1 passes through the a focal enlargement relay systems 51 and 52, and reaches the spatial filter 53 arranged at a position substantially conjugate with the entrance pupil Ep. Of reflected light components, which are returned to be coaxial with the principal rays of the beams $LB_{1P}$ and $LB_{2P}$, the 0th-order light component $L_O$, and 1st-order diffracted light components $RL_1$ and $RL_2$ (FIGS. 3 and 4) from the reticle marks $RM_1$ and $RM_2$ are cut by the filter 53, and only the interference light $BTL_W$ is extracted. The interference light $BTL_W$ is received by the photoelectric detector 56 through the mirror 54 and the focusing lens 55. The photoelectric detector 56 makes a photoelectric signal corresponding to the interference light $BTL_W$. The photoelectric signal is output to the phase detection system 27 as a sine-wave AC signal according to the cycle of a change between light and dark patterns of interference fringes, i.e., an optical beat signal $SD_W$ having a beat frequency equal to the frequency difference Δf.

In this embodiment, only the alignment system for detecting the wafer mark WM1 and the transparent window $RW_1$ is illustrated. However, in practice, four sets of alignment systems are arranged in correspondence with wafer marks (e.g., WM1) arranged around a shot region, and three sets of reticle alignment systems are arranged in correspondence with reticle alignment marks (e.g., $RX_2$).

As shown in FIG. 2, the phase detection system 27 detects phase differences between the optical beat signal SR as the reference signal made by a reference signal making section 13, and the optical beat signals $SD_W$ and $SD_R$ made by the first and second measured signal making sections 20 and 18 so as to obtain a relative phase difference between the two optical beat signals $SD_W$ and $SD_R$. The system 27 outputs the phase difference information to the main control system 28. The main control system 28 calculates a relative positional shift between the transparent window RW and the wafer mark WM1 on the basis of the phase difference information from the phase detection system 27 with high precision within a range of $\pm P_W/4$ of the grating pitch $P_W$. The main control system 28 systematically controls the interferometer 9, the drive motor 8, and the phase detection system 27, so that the projected image of the pattern region PA of the reticle R can accurately coincide with the shot region.

The field stop 15 arranged at the wafer conjugate plane IPa will be described below.

The field stop 15 arbitrarily sets a pattern of alignment illumination light on the wafer (illumination region SA). The stop 15 is constituted by the stop 15a arranged on the sagittal image surface of the wafer with respect to the projection optical system PL, and the stop 15b arranged on the meridional image surface of the wafer with respect to the projection optical system PL. These two stops are separated by a distance corresponding to the astigmatic difference in the direction of the optical axis AXa of the illumination system, so that the edges of the two stops are perpendicular to each other. Thus, the images of these stops are formed on the wafer W to define the illumination region SA. These two stops can prevent adverse influences due to the astigmatism of the projection optical system caused when alignment light having a wavelength different from that of exposure light is incident on the projection optical system PL from a direction outside the optical axis.

Figure 1A:
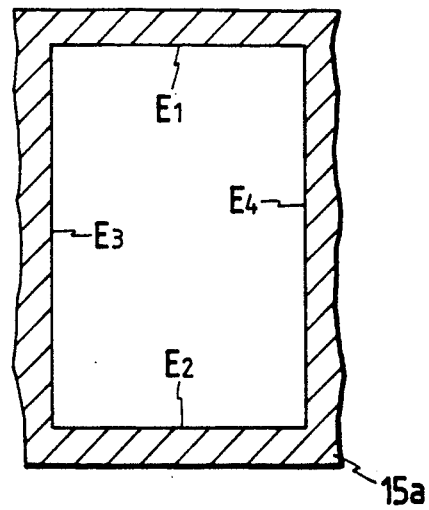
FIGS. 1A and 1B respectively show patterns of stops 15a and 15b according to the first embodiment of the present invention.
Figure 1B:
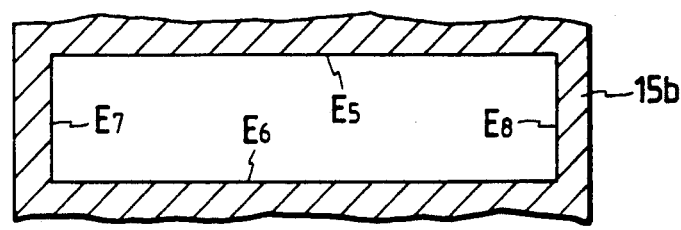
Figure 1C:
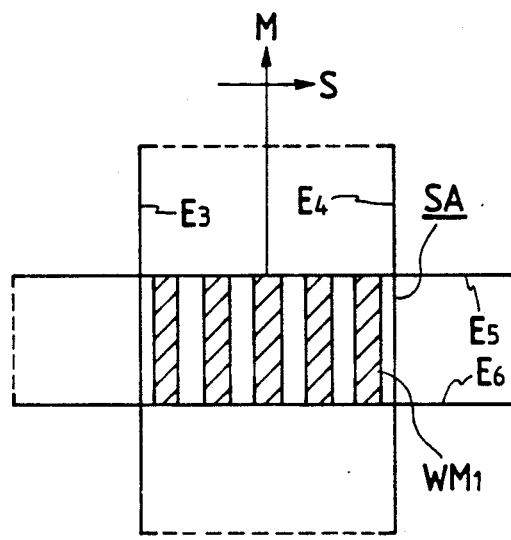
FIG. 1C shows illumination regions defined by these stops.

FIGS. 1A and 1B show these two stops, and FIG. 1C shows the illumination region (illumination field) SA defined by these stops. In FIG. 1A, the stop 15a is constituted by a light-shielding portion and a light-transmission portion. The hatched portion in FIG. 1A represents the light-shielding portion. The stop 15a has edges E1 and E2 extending in the S direction, and edges E3 and E4 extending in the M direction. The images of the edges (edges for defining the S direction) E3 and E4 extending in the M direction are formed on the wafer. In FIG. 1B, the stop 15b is constituted by a light-shielding portion and a light-transmission portion. The hatched portion in FIG. 1B represents the light-shielding portion. The stop 15b has edges E5 and E6 extending in the S direction, and edges E7 and E8 extending in the M direction. The images of the edges (edges for defining the M direction) E5 and E6 extending in the S direction are formed on the wafer. The stops 15a and 15b are arranged in planes substantially conjugate with the wafer W, so that the images of edges (E3 and E4) and (E5 and E6) are formed, and are separated by a distance corresponding to the astigmatic difference in the direction of the optical axis AXa of the illumination system. As a result, the two stops 15a and 15b define the illumination region SA for illuminating only the wafer alignment mark WM1 (FIG. 1C). For this reason, no noise light from a portion other than the mark WM1 is generated, and noise light can be prevented from being mixed in a signal detected by the photoelectric detector 56. The sizes and shapes of the stops 15a and 15b can be determined in accordance with the mark WM1. The stops 15a and 15b may comprise variable stops, so that at least the edges E3 and E4 of the stop 15a which extend in the M direction, and the edges E5 and E6 of the stop 15b which extend in the S direction can be driven in a plane perpendicular to the optical axis AXa of the illumination system.

The optical arrangement of the stop will be described below.

The beams $LB_1$ and $LB_2$ shown in FIG. 4 cross at the stop 15a arranged on the sagittal image surface, and thereafter, cross again on the focal plane 25 (rear-side focal plane of the objective lens 22) and the surface of the wafer W. This fact means that the stop 15a and the wafer W have a focusing relationship therebetween. Note that the focal plane 25 becomes substantially conjugate with the wafer surface at the wavelength of the alignment illumination light LB, and the interval between the focal plane 25 and the pattern surface of the reticle R corresponds to the axial chromatic aberration amount $\Delta L$ of the projection optical system PL. $\Delta Z$ indicates an astigmatic difference of the projection optical system PL with respect to the alignment light. In this embodiment, the alignment light is He-Ne laser light having almost no sensitivity with a resist. However, the present invention is not limited to this. Even when light having a sensitivity with a resist is used as alignment light, it is effective to use the two stops 15a and 15b having the above-mentioned arrangements as along as an astigmatic difference occurs due to a difference in wavelength from exposure light.

Solid lines in FIG. 5 indicate a state wherein beams indicated by the solid lines are incident on the wafer W after the size of the illumination region is defined by the stop 15b. Broken lines indicate a focusing relationship between the stop 15b and the wafer W.

In general, when the alignment light has a wavelength longer than that of the exposure light, the S (sagittal) image surface is formed at the side of the alignment light source, and the M (meridional) image surface is formed at the side of the wafer.

A length dS of the edge E1 or E2 in the short-side direction of the stop 15a can be calculated by dividing the length, in the measurement direction (long-side direction, S direction), of an imaginary illumination region for illuminating only the wafer alignment mark WM1 with a projection magnification $M_S$ (a projection magnification for focusing the stop 15a on the wafer W). Similarly, a length dM of the edge E7 or E8 in the short-side direction of the stop 15b can be calculated by dividing the length, in the non-measurement direction (short-side direction, M direction), of an imaginary illumination region for illuminating only the wafer alignment mark WM1 with a projection magnification $M_M$ (a projection magnification for focusing the stop 15b on the wafer W).

An interval $\Delta D_S$ between the two beams $LB_{1P}$ and $LB_{2P}$ when they pass through the stop 15b is determined based on the astigmatic difference $\Delta Z$ and a crossing angle $2\theta_S$ defined when the beams cross at the stop 15a, and is given by $\Delta D_S = 2 \cdot \Delta Z \cdot \tan\theta_S$.

It is preferable that the lengths of the edges in the long-side direction of the stops 15a and 15b are set to be infinite values. However, it is difficult to realize this. For this reason, a length dS1 of the edge E3 or E4 in the long-side direction of the stop 15a is preferably set to be longer than at least the beam spot size. If this length is shorter than the beam spot size, diffracted light components are produced from the edges in the short-side direction of the stop 15a, and make the illuminance distribution on the stop 15b nonuniform, thus adversely influencing the illuminance distribution on the wafer W. On the other hand, a length dM1 of the edge E5 or E6 in the long-side direction of the stop 15b must be determined not to shield two beams, which pass through the stop 15b to be separated at the interval $\Delta D_S$. The length dM1 is preferably set to be long enough not to shield beams passing through the projection optical system. More specifically, the length dM1 is preferably set to be $dM1 = dS + 2 \cdot NA \cdot \Delta Z / M_S$ or more.

Since the field stops in both the S and M directions are arranged in the illumination system, the illumination region SA of alignment detection light on the wafer W is limited to the wafer alignment mark WM1. Therefore, a positional shift can be detected with high precision without being influenced by noise light from marks other than the wafer alignment mark WM1 and from a circuit pattern.

A modification of this embodiment will be described below.

In the above embodiment, the stop 15 is arranged at a position nearer the laser light source 10 than the first and second measured signal making sections. However, in this modification, the stop 15 is arranged at a position nearer the wafer W than the first and second measured signal making sections, e.g., at the wafer conjugate position 25. With this arrangement, detection light returned from the wafer W is not easily influenced by, e.g., stray light since it passes through the stops 15a and 15b. Stray light includes [1] stray light between the projection optical system PL and the reticle R, [2] stray light caused by reflection among the lens elements of the projection optical system PL, and [3] stray light between the projection optical system PL and the wafer W. The stops 15a and 15b arranged as described above can effectively prevent the stray light components [2] and [3].

Figure 7:
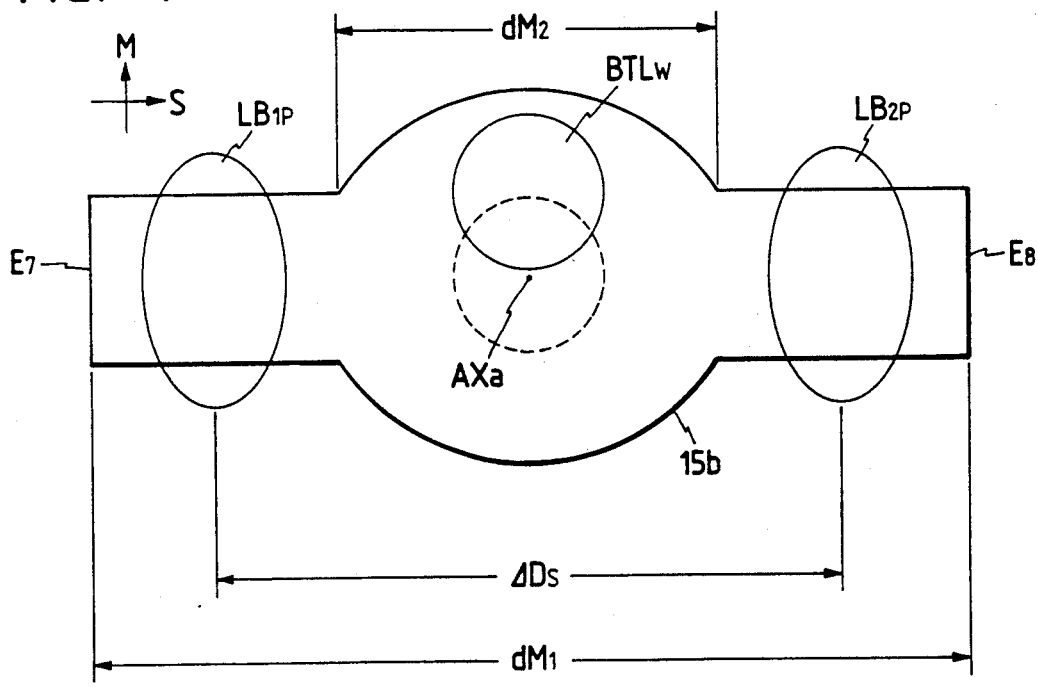
FIG. 7 is a view showing a modification of a pattern of the stop 15b shown in FIG. 1B.

In this case, interference light may be shifted from the optical axis AXa of the illumination system due to an aberration, and may be undesirably shielded by the edges of the stop 15b arranged on the meridional image surface of the wafer W. In the above embodiment, the stops 15a and 15b have rectangular patterns. In this modification, the stop 15b arranged on the meridional image surface of the wafer W has an expanded central portion by a length dM2 in the S direction, as shown in FIG. 7. With this pattern, even when interference light $BTL_W$ is shifted from the optical axis AXa of the illumination system, it can be avoided from being shielded by the stop 15b. The interference light $BTL_W$ indicated by a broken circle represents a case wherein it passes along the optical axis AXa of the illumination system. The interference light $BTL_W$ indicated by a solid circle represents a case wherein it is shifted from the optical axis AXa of the illumination system. The linear edge portions of the stop 15b which extend in the S direction restrict the beams $LB_{1P}$ and $LB_{2P}$, and form the images of the edges extending in the M direction on the wafer W. Therefore, when the stop 15b having the linear edges and the expanded central portion is arranged in combination with the stop 15a, the interference light $BTL_W$ from the wafer can be prevented from being shielded, and a predetermined illumination region can be defined.

Note that the stop 15b may comprise a stop having two pairs of linear edges extending in the S direction, and juxtaposed in the M direction, and these two pairs of edges may be arranged to be separated by dM2 in the S direction.

In this case, it is preferable that the length dS1 of the edge E3 or E4 in the long-side direction of the stop 15a is larger than the beam spot size, and is large enough not to shield light beams passing through the pupil surface Ep of the projection optical system PL. More specifically, it is preferable that the length dS1 of the edge in the long-side direction of the stop 15a is larger than the beam spot size, and is equal to or larger than $dM+2 \cdot NA \cdot \Delta Z/M_M$ (NA is the reticle-side numerical aperture of the projection optical system PL). Note that the lengths dS of the edges in the short-side direction of the stops 15a and 15b, and the length dM1 in the long-side direction of the stop 15b are determined under the same conditions as those in the above embodiment. Another modification will be described below.

In this modification, the edges E1 and E2, extending in the S direction, of the field stop 15a for defining the field in the measurement direction of the wafer alignment mark WMI are slightly inclined in a plane perpendicular t the optical axis AXa of the illumination system, so that the illumination field on the wafer W formed by the field stops 15a and 15b has a rhombic or trapezoidal pattern. With this arrangement, diffracted light caused by the edges E1 and E2 of the field stop 15a which extend in the S direction can be prevented from becoming incident on the photoelectric detector, thereby avoiding an alignment error.

Figure 8:
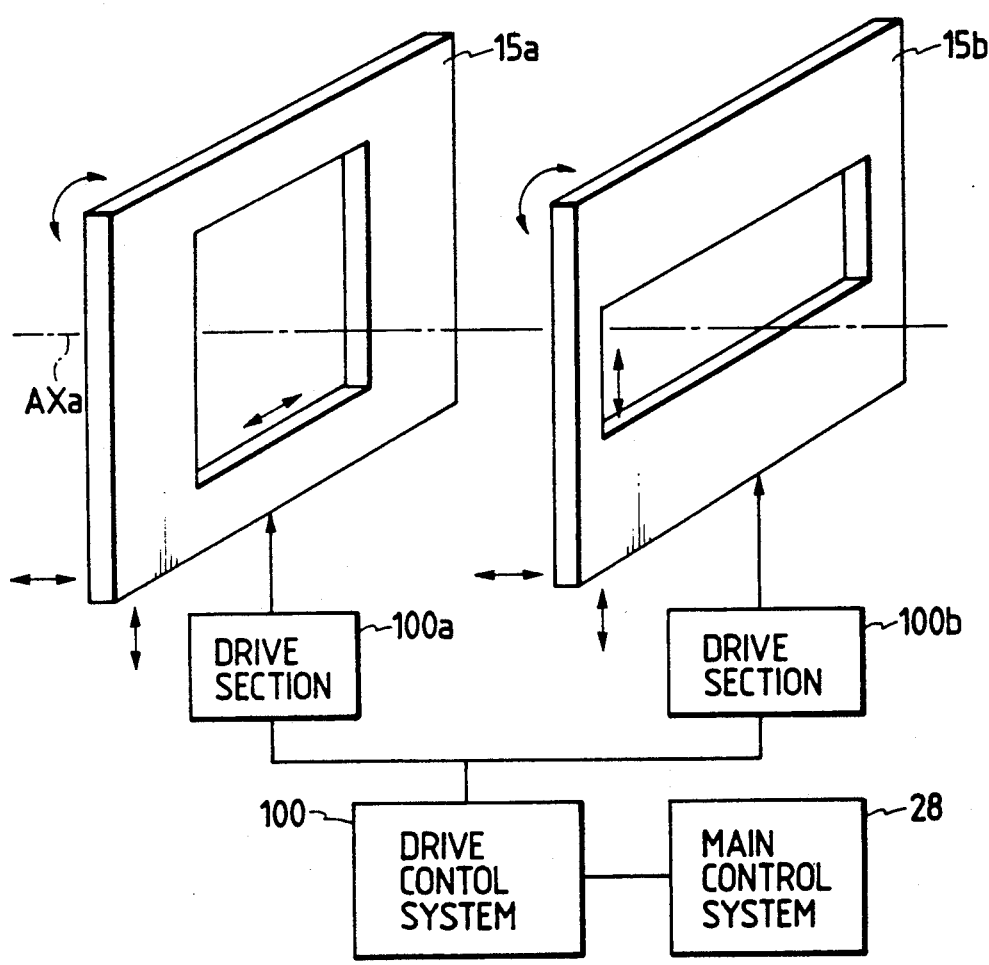
FIG. 8 is a view showing a modification of the stops 15a and 15b.
Figure 10:
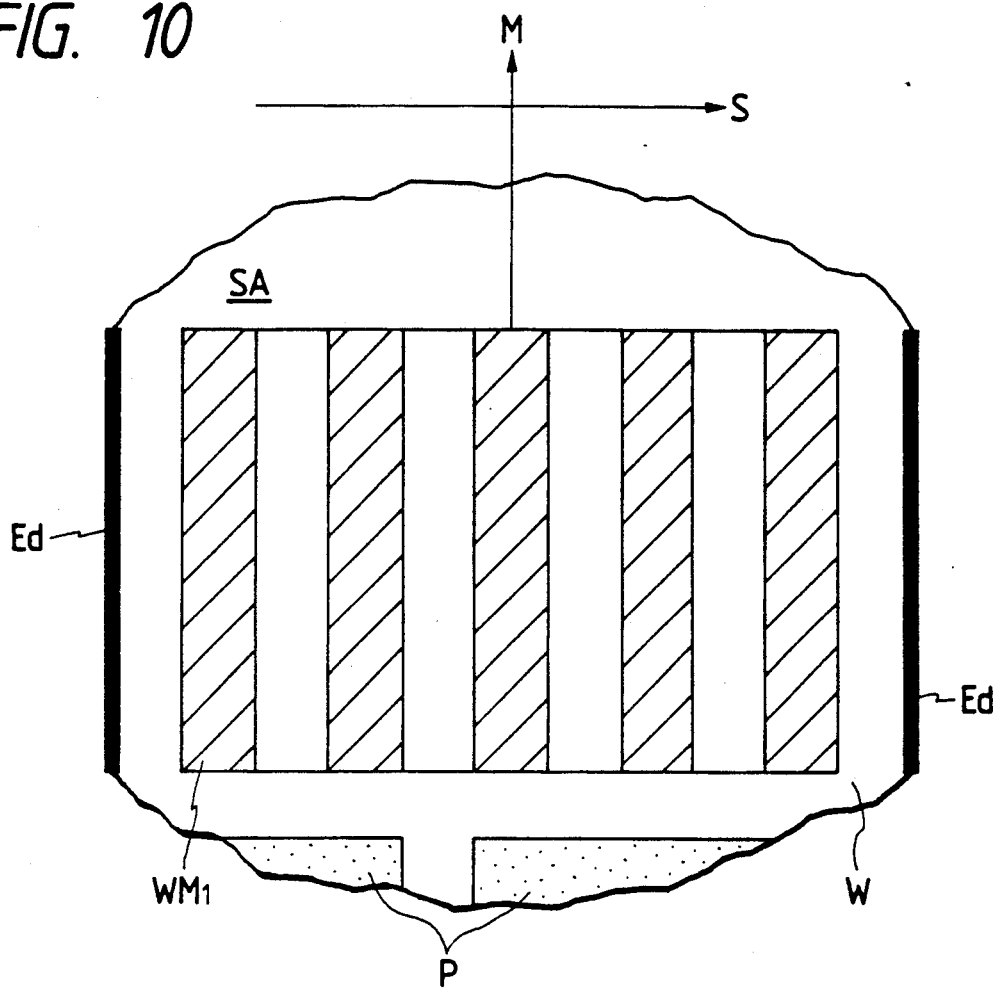
FIG. 10 is a view showing an alignment illumination region defined by a conventional stop.
Figure 11:
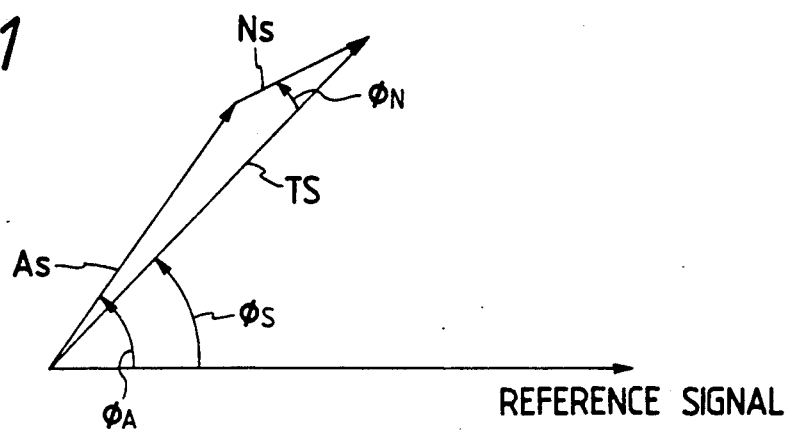
FIG. 11 is a diagram showing the principle of a phase shift caused by noise.
Figure 12:
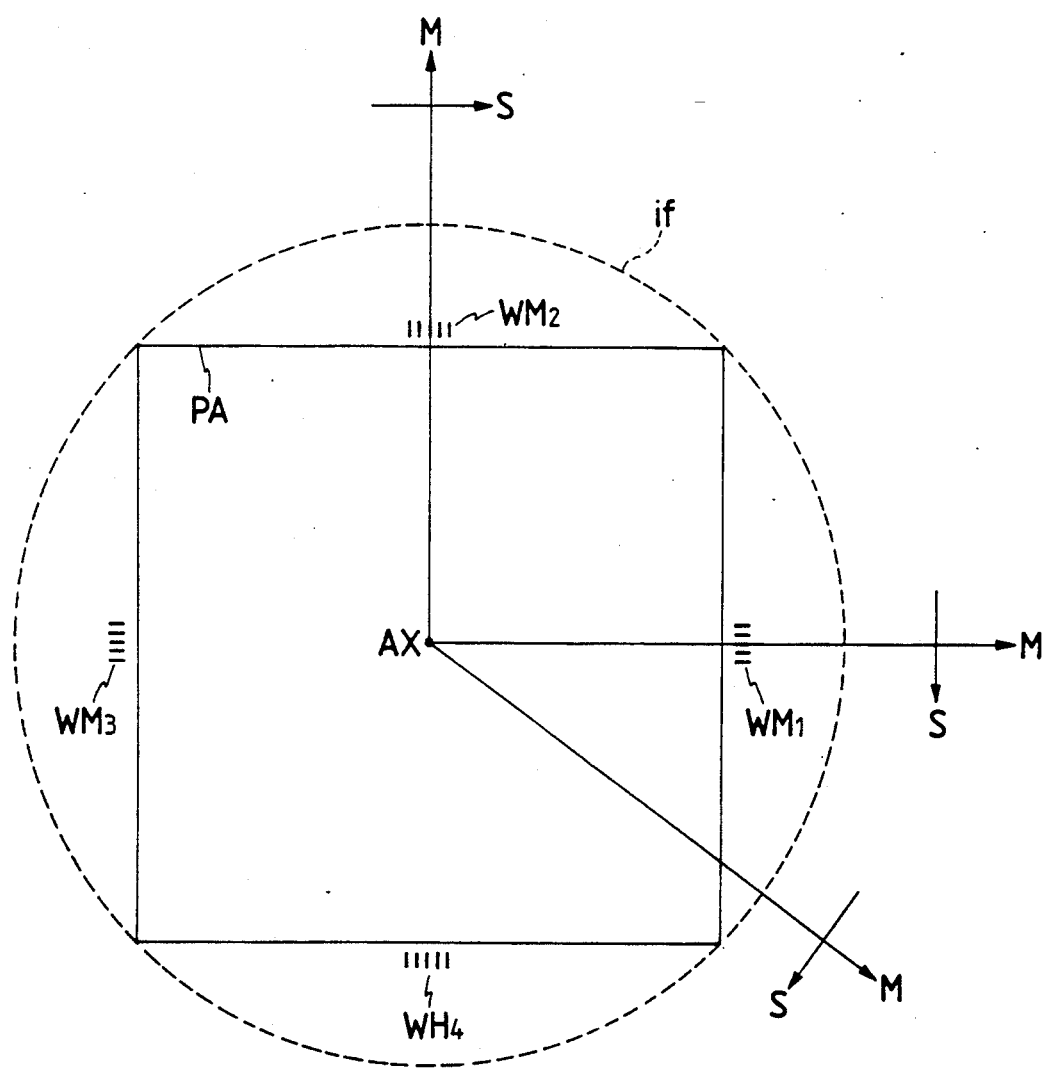
FIG. 12 is a view showing the positional relationship between a visual field of a projection optical system and an alignment mark.

In the above description, the stops 15a and 15b have predetermined linear edges, and are perpendicular to each other. In still another modification, as shown in FIG. 8, the edges of the stops are arranged to be rotatable or movable in a plane perpendicular to the optical axis AXa of the illumination system by a drive control system 100 including drive-sections 100a and 100b, and the stops 15a and 15b are arranged to be movable in the direction of the optical axis AXa of the illumination system. For example, as shown in FIG. 2, the alignment system 24 can be moved by the drive control system 23 in correspondence with the position of a reticle mark, which changes according to a change in size of the reticle pattern region PA. With this movement, since the image height position of alignment light upon incidence on the projection optical system changes, the chromatic aberration $\Delta L$, the astigmatic difference $\Delta Z$, and the projection magnification M of alignment light are changed accordingly. In this case, in order to cope with the changed astigmatic difference $\Delta Z$, the stop 15 can be arranged to be rotatable or movable in a plane perpendicular to the optical axis AXa of the illumination system or to be movable in the direction of the optical axis AXa by the drive control system 100, and furthermore, the sizes of the edges can be varied to adopt a proper arrangement according to a change in astigmatism. An example of this method will be explained below. The relationships among the incident position of alignment light onto the projection optical system PL, the arrangement of the stop 15 (the interval between the stops 15a and 15b, and the like), the sizes of the edges, and the like are stored in advance in the main control system 28 as table values. Drive amount information from the drive control system 23 is input to the main control system 28. The main control system 28 obtains the incident position of the alignment light on the basis of the information from the drive control system 23. A proper arrangement condition of the stop 15 is obtained on the basis of the obtained incident position and the table values. The main control system 28 controls the drive control system 100 so as to satisfy the obtained condition.

The optical path length between the illumination system and the reticle is corrected or the crossing angle $2\theta_R$ is corrected in correspondence with changes in chromatic aberration $\Delta L$ or astigmatic difference $\Delta Z$ by the same control method as described above.

Only the wafer alignment mark WM1 has been described. The same applies to the marks WM2 to WM4. Note that the alignment method using interference light obtained by causing two beams to be incident on a diffraction-grating-like pattern on a wafer has been described. However, the present invention is not limited to this. For example, the stops of this embodiment can be applied to a method wherein ±1st-order diffracted light components obtained by causing one beam to be vertically incident on a diffraction-grating-like pattern on a wafer are interfered with each other. The stops of this embodiment can be applied to either a heterodyne or homodyne method in the alignment method using interference light.

The second embodiment according to the present invention will be described below with reference to FIGS. 9A and 9B. The same reference numerals in this embodiment denote members having the same effects and functions as those in the first embodiment.

In the description of the first embodiment, two stops are arranged in a system employing the alignment method using interference light. However, the present invention is not limited to this. For example, the present invention can be applied to an LSA method in a system for performing alignment through a projection optical system PL. This state will be described below with reference to FIGS. 9A and 9B. FIG. 9A is a plan view showing a portion of an LSA alignment system when viewed from the S direction, and FIG. 9B is a plan view showing a portion of the LSA alignment system when viewed from the M direction. In FIG. 9A, a laser beam emitted from an alignment laser light source (He-Ne laser) 10 is focused on the sagittal image surface, where a stop 15a is arranged, through a beam splitter 102 and a lens system 101, and thereafter, is focused on a wafer W through a projection optical system PL.

The stop 15a and the wafer W have a conjugate relationship therebetween through the projection optical system PL with respect to alignment light. The role of the stop 15a arranged at the beam waist position is not to define the range of an illumination region SA in the S direction, but to prevent stray light from, e.g., the projection optical system PL. On the other hand, the focusing relationship between the wafer W and a stop 15b when the alignment system is viewed from the M direction can be expressed in the same manner as in FIG. 5. This state will be briefly described below with reference t FIG. 9B. A light beam emitted from the laser light source 10 is converted into slit-like spot light by the lens system 101 through the beam splitter 102, is restricted by the stop 15b arranged on the meridional image surface, and is then focused on the wafer W through the projection optical system PL. The stop 15b and the wafer W have a conjugate relationship therebetween through the projection optical system PL with respect to alignment light, as indicated by broken lines in FIG. 9B. The stop 15b can define the range of the illumination field SA in the M direction. When the light beam radiates an alignment mark on the wafer W, diffracted light components are produced from the mark. The diffracted light components propagate in the reverse direction through the projection optical system PL, and are then incident on a photoelectric detection system 103 through the beam splitter 102. In this manner, the LSA method uses two stops, so that one stop defines the illumination region, and the other stop prevents stray light.

In a system for detecting scattered or diffracted light components from an alignment mark using slit light formed by focusing rectangular edges in place of slit-like beam spot light in the same manner as in the LSA method, the two stops, i.e., the stops 15a and 15b are effective to define the illumination field.

Furthermore, in an illumination system of an alignment method for detecting an image of a mark using a camera such as a vidicon, a CCD, or the like, the two stops like in this embodiment can be arranged in an illumination optical path, and the mark position can be detected with high precision without being influenced by noise light or inter-surface reflection among lenses.

As described above, the two stops according to the present invention can be applied to various alignment sensors. Light may be radiated with or without going through a reticle as long as a mark on the wafer W is irradiated with light through the projection optical system PL to detect the mark.

The above-mentioned two stops may have an integrated structure such that the light-shielding portion of the stop 15a is formed by, e.g., a chromium layer on one surface of a glass plate, and the light-shielding portion of the stop 15b is formed by, e.g., a chromium layer on the other surface. In this case, the thickness of the glass plate between the stops 15a and 15b may correspond to the astigmatic difference in consideration of a refractive index.

What is claimed is:

1. A projection exposure apparatus for projecting a predetermined pattern formed on a mask onto a photosensitive substrate, comprising;
   a projection optical system for forming an image of the pattern on said substrate under exposure light having a first wavelength;
   an illumination system for illuminating a mark on said photosensitive substrate with light having a second wavelength different from the first wavelength through said projection optical system so as to attain alignment; and said mark,
   said illumination system comprising;
   a light source for emitting the light having the second wavelength;
   a first field stop for defining an illumination region on said photosensitive substrate said first field stop having at least two linear edges which extend in a direction substantially perpendicular to a sagittal direction in a visual field of said projection optical system and which are juxtaposed at a predetermined interval in the sagittal direction; and
   a second field stop, for defining an illumination region on said photosensitive substrate, said second field stop having at least two linear edges which extend in a direction substantially perpendicular to a meridional direction in a visual field of said projection optical system and which are juxtaposed to be separated at a predetermined interval in the meridional direction: and
   said first and second field stops being juxtaposed to be separated in an optical axis direction of said illumination system by a distance according to an astigmatism of said projection optical system caused by the light having the second wavelength, and said edges of said first and second field stops being focused on said photosensitive substrate through said projection optical system.

2. An apparatus according to claim 1, wherein said first and second field stops are arranged between said substrate and said light source.

3. An apparatus according to claim 1, wherein said first and second field stops are arranged between said detection system and said substrate.

4. An apparatus according to claim 1, wherein said first and second field stops are integrally formed.

5. An apparatus according to claim 1, further comprising:

first drive means for moving said first and second field stops along an optical axis of said projection optical system; and second drive means for two-dimensionally moving, or rotating said first and second field stops in a plane substantially perpendicular to an optical axis direction of said projection optical system.

6. A position detection apparatus for detecting a mark on a substrate through a projection optical system, whose aberration is corrected under light having a predetermined first wavelength, comprising:

an illumination system for illuminating the mark with light having a second wavelength different from the first wavelength through said projection optical system so as to attain position detection; and a detection system for detecting light from the mark, said illumination system comprising:

a light source for emitting the light having the second wavelength;

a first field stop, having at least two linear edges, for defining an illumination region on said substrate;

a second field stop, having at least two linear edges which cross said at least two linear edges of said first field stop at a predetermined angle, for defining an illumination region on said substrate; and said first and second field stops being arranged to be separated in an optical axis direction of said illumination system by a distance according to an astigmatism of said projection optical system caused by the light having the second wavelength.

7. An apparatus according to claim 6, wherein said at least two linear edges of said first field stop extend in a direction substantially perpendicular to a sagittal direction in a visual field of said projection optical system, and are juxtaposed to be separated at a predetermined interval in the sagittal direction, and said at least two linear edges of said second field stop extend in a direction substantially perpendicular to a meridional direction in a visual field of said projection optical system, and are juxtaposed to be separated at a predetermined interval in the meridional direction.

* * * * *